United States Patent
Mathew et al.

(10) Patent No.: US 11,003,213 B2
(45) Date of Patent: May 11, 2021

(54) PORTABLE COMPUTER DISPLAY STRUCTURES

(71) Applicant: Apple Inc., Cupertino, CA (US)

(72) Inventors: Dinesh C. Mathew, San Francisco, CA (US); Thomas W. Wilson, Jr., Saratoga, CA (US); Victor H. Yin, Cupertino, CA (US); Bryan W. Posner, San Francisco, CA (US); Chris Ligtenberg, San Carlos, CA (US); Brett W. Degner, Menlo Park, CA (US); Peteris K. Augenbergs, Woodside, CA (US)

(73) Assignee: Apple Inc., Cupertino, CA (US)

( * ) Notice: Subject to any disclaimer, the term of this patent is extended or adjusted under 35 U.S.C. 154(b) by 0 days.

(21) Appl. No.: 16/437,830

(22) Filed: Jun. 11, 2019

(65) Prior Publication Data

US 2019/0294214 A1    Sep. 26, 2019

Related U.S. Application Data

(63) Continuation of application No. 15/782,458, filed on Oct. 12, 2017, now Pat. No. 10,353,432, which is a (Continued)

(51) Int. Cl.
*G06F 1/16* (2006.01)
*H05K 5/00* (2006.01)
(Continued)

(52) U.S. Cl.
CPC .......... *G06F 1/1637* (2013.01); *G06F 1/1601* (2013.01); *G06F 1/1658* (2013.01); (Continued)

(58) Field of Classification Search
CPC .... G06F 1/1637; G06F 1/1601; G06F 1/1658; H05K 5/0017
(Continued)

(56) References Cited

U.S. PATENT DOCUMENTS

| 4,769,680 A | 9/1988 | Resor, III et al. |
| 5,032,007 A | 7/1991 | Silverstein et al. |

(Continued)

FOREIGN PATENT DOCUMENTS

| JP | 01117077 | 5/1989 |
| JP | 05176151 | 7/1993 |

(Continued)

OTHER PUBLICATIONS

"LCD with Embedded Camera for Picture Telephone," IBM Corporation Research Disclosure 42572, Sep. 1999.

*Primary Examiner* — Kaveh C Kianni
(74) *Attorney, Agent, or Firm* — David K. Cole

(57) ABSTRACT

An electronic device housing may have upper and lower portions that are attached with a hinge. At least one portion of the housing may have a rear planar surface and peripheral sidewalls having edges. A display module may be mounted in the housing. The display module may have glass layers such as a color filter glass layer and a thin-film transistor substrate. The color filter glass layer may serve as the outermost glass layer in the display module. The edges of the display module may be aligned with the edges of the peripheral housing sidewalls to create the appearance of a borderless display for the electronic device. The display module may be provided with an opening that allows a camera or other electronic components to receive light. Traces may be provided on the underside of the thin-film transistor substrate to serve as signal paths for the electrical components.

13 Claims, 13 Drawing Sheets

Related U.S. Application Data continuation of application No. 14/520,079, filed on Oct. 21, 2014, now abandoned, which is a continuation of application No. 13/786,344, filed on Mar. 5, 2013, now Pat. No. 8,866,989, which is a continuation of application No. 13/249,174, filed on Sep. 29, 2011, now Pat. No. 8,395,722, which is a continuation of application No. 12/483,206, filed on Jun. 11, 2009, now Pat. No. 8,456,586.

(51) Int. Cl.
  *G02F 1/1333* (2006.01)
  *H01L 27/12* (2006.01)

(52) U.S. Cl.
  CPC ....... *H05K 5/0017* (2013.01); *G02F 1/13332* (2021.01); *G02F 1/133308* (2013.01); *G02F 1/133317* (2021.01); *G02F 1/133331* (2021.01); *H01L 27/124* (2013.01); *H01L 27/1214* (2013.01); *H01L 27/1218* (2013.01)

(58) Field of Classification Search
  USPC .................................................... 361/679
  See application file for complete search history.

(56) References Cited

U.S. PATENT DOCUMENTS

| | | | |
|---|---|---|---|
| 5,358,412 A * | 10/1994 | Maurinus | G02F 1/13452 349/150 |
| 5,359,206 A * | 10/1994 | Yamamoto | G02F 1/1345 257/350 |
| 5,481,430 A | 1/1996 | Miyagawa et al. | |
| 5,539,550 A | 7/1996 | Spitzer et al. | |
| 5,572,343 A | 11/1996 | Okamura et al. | |
| 5,623,392 A | 4/1997 | Ma | |
| 5,631,753 A * | 5/1997 | Hamaguchi | G02F 1/133512 257/E31.122 |
| 5,678,483 A | 10/1997 | Johnson | |
| 5,708,561 A | 1/1998 | Huilgol et al. | |
| 5,739,800 A | 4/1998 | Lebby et al. | |
| 5,748,270 A | 5/1998 | Smith | |
| 5,760,858 A | 6/1998 | Hodson et al. | |
| 5,801,684 A * | 9/1998 | Uskali | G09G 3/3611 345/102 |
| 5,851,411 A | 12/1998 | An et al. | |
| 5,889,568 A | 3/1999 | Seraphim et al. | |
| 5,940,153 A * | 8/1999 | Castaneda | G02F 1/133308 349/58 |
| 5,965,916 A * | 10/1999 | Chen | G02F 1/136209 257/347 |
| 5,988,827 A * | 11/1999 | Lee | G01D 11/28 362/633 |
| 5,990,986 A | 11/1999 | Song et al. | |
| 6,104,461 A * | 8/2000 | Zhang | G02F 1/136209 349/122 |
| 6,177,214 B1 * | 1/2001 | Yokoyama | B41J 3/407 347/1 |
| 6,278,504 B1 | 8/2001 | Sung | |
| 6,335,773 B1 | 1/2002 | Kamei | |
| 6,429,057 B1 | 8/2002 | Hong et al. | |
| 6,462,806 B2 | 10/2002 | Zhang et al. | |
| 6,483,719 B1 | 11/2002 | Bachman | |
| 6,525,786 B1 | 2/2003 | Ono | |
| 6,532,152 B1 * | 3/2003 | White | G02F 1/133308 361/692 |
| 6,570,757 B2 | 5/2003 | DiFonzo et al. | |
| 6,583,439 B2 | 6/2003 | Yamazaki et al. | |
| 6,587,151 B1 * | 7/2003 | Cipolla | G06F 1/1607 348/207.1 |
| 6,646,689 B2 | 11/2003 | Matsuda | |
| 6,776,497 B1 | 8/2004 | Huppi et al. | |
| 6,842,211 B2 | 1/2005 | Katsura | |
| 6,870,529 B1 * | 3/2005 | Davis | G09G 5/10 345/207 |
| 6,919,678 B2 | 7/2005 | Ozolins et al. | |
| 6,940,564 B2 * | 9/2005 | Murden | G02F 1/1333 349/1 |
| 6,977,808 B2 | 12/2005 | Lam et al. | |
| 7,013,558 B2 | 3/2006 | Bachman | |
| 7,035,090 B2 * | 4/2006 | Tanaka | G06F 1/162 345/169 |
| 7,092,066 B2 | 8/2006 | Matsuda | |
| 7,110,059 B2 | 9/2006 | Zhang | |
| 7,133,104 B2 | 11/2006 | Kim et al. | |
| 7,161,185 B2 | 1/2007 | Yamazaki et al. | |
| 7,188,965 B2 | 3/2007 | Chang et al. | |
| 7,217,588 B2 * | 5/2007 | Hartzell | B81C 1/0023 438/51 |
| 7,227,185 B2 | 6/2007 | Lin | |
| 7,237,941 B2 | 7/2007 | Hsieh et al. | |
| 7,245,333 B2 | 7/2007 | Nam et al. | |
| 7,253,869 B1 * | 8/2007 | Russell | G02F 1/13454 349/158 |
| 7,271,871 B2 | 9/2007 | Jen et al. | |
| 7,282,380 B2 | 10/2007 | Maruyama et al. | |
| 7,286,173 B2 | 10/2007 | Zhang et al. | |
| 7,420,608 B2 | 9/2008 | Yamasaki | |
| 7,425,749 B2 * | 9/2008 | Hartzell | B81C 1/00246 257/414 |
| 7,443,460 B2 | 10/2008 | Park | |
| 7,468,774 B2 | 12/2008 | Sakama | |
| 7,489,291 B2 * | 2/2009 | Yamazaki | G09G 3/3648 345/76 |
| 7,505,436 B2 | 3/2009 | Bachman | |
| 7,522,236 B2 | 4/2009 | Gettemy et al. | |
| 7,525,629 B2 | 4/2009 | Konuma et al. | |
| 7,528,912 B2 | 5/2009 | Zhang et al. | |
| 7,551,358 B2 | 6/2009 | Lee et al. | |
| 7,569,410 B2 | 8/2009 | Hartzell et al. | |
| 7,582,904 B2 | 9/2009 | Fujii et al. | |
| 7,585,121 B2 | 9/2009 | Tsai | |
| 7,586,565 B2 | 9/2009 | Kao | |
| 7,618,683 B2 | 11/2009 | Tsuchimura | |
| 7,629,613 B2 | 12/2009 | Sihn et al. | |
| 7,663,607 B2 | 2/2010 | Hotelling et al. | |
| 7,697,092 B2 | 4/2010 | Yi et al. | |
| 7,728,906 B2 | 6/2010 | Bilbrey | |
| 7,728,937 B2 | 6/2010 | Kume et al. | |
| 7,764,335 B2 | 7/2010 | Tanaka et al. | |
| 7,790,487 B2 | 9/2010 | Shih et al. | |
| 7,800,707 B2 | 9/2010 | Hsieh et al. | |
| 7,812,920 B2 * | 10/2010 | Iino | G02F 1/133516 348/362 |
| 7,813,042 B2 | 10/2010 | Mather et al. | |
| 7,821,561 B2 | 10/2010 | Tsuboi | |
| 7,829,391 B2 | 11/2010 | Okada et al. | |
| 7,830,370 B2 * | 11/2010 | Yamazaki | G09G 3/30 345/204 |
| 7,852,440 B2 | 12/2010 | Kunimori et al. | |
| 7,859,606 B2 * | 12/2010 | Higaki | H01L 27/12 349/46 |
| 7,868,957 B2 * | 1/2011 | Yamazaki | H01L 21/28008 349/43 |
| 7,883,232 B2 | 2/2011 | Bang | |
| 7,894,021 B2 | 2/2011 | Yang et al. | |
| 7,898,585 B2 | 3/2011 | Nam | |
| 7,903,206 B2 | 3/2011 | Nakamura et al. | |
| 7,907,230 B2 | 3/2011 | Goto et al. | |
| 7,924,362 B2 | 4/2011 | Slobodin | |
| 7,929,046 B2 | 4/2011 | Okamura | |
| 7,929,075 B2 * | 4/2011 | Lee | G02F 1/133308 349/58 |
| 7,933,123 B2 | 4/2011 | Wang et al. | |
| 7,936,346 B2 | 5/2011 | Kunimori et al. | |
| 7,995,183 B2 | 8/2011 | Yamazaki et al. | |
| 8,004,629 B2 | 8/2011 | Miyata | |
| 8,013,454 B2 | 9/2011 | Yamashita et al. | |
| 8,018,558 B2 | 9/2011 | Kubota | |
| 8,033,708 B2 | 10/2011 | Tsubaki | |
| 8,049,221 B2 | 11/2011 | Komori | |

(56) References Cited

U.S. PATENT DOCUMENTS

| | | |
|---|---|---|
| 8,059,231 B2 | 11/2011 | Kim |
| 8,130,354 B2 | 3/2012 | Kimura |
| 8,149,279 B2 | 4/2012 | Guo |
| 8,154,679 B2 | 4/2012 | Kim |
| 8,194,138 B2 | 6/2012 | Shen |
| 8,199,294 B2 | 6/2012 | Hakoi et al. |
| 8,199,477 B2 | 6/2012 | Mathew et al. |
| 8,203,677 B2 | 6/2012 | Sakai |
| 8,248,559 B2 | 8/2012 | Morita |
| 8,253,875 B2 | 8/2012 | Kim |
| 8,253,890 B2 | 8/2012 | Zhong et al. |
| 8,274,814 B2 | 9/2012 | Tokunaga et al. |
| 8,350,985 B2 | 1/2013 | Hasegawa |
| 8,369,702 B2 | 2/2013 | Sanford et al. |
| 8,395,722 B2 | 3/2013 | Mathew et al. |
| 8,408,780 B2 | 4/2013 | Mathew et al. |
| 8,456,586 B2 | 6/2013 | Mathew et al. |
| 8,467,177 B2 | 6/2013 | Mathew et al. |
| 8,492,249 B2 | 7/2013 | Dairiki et al. |
| 8,508,495 B2 | 8/2013 | Hotelling et al. |
| 8,556,444 B2 | 10/2013 | Kim et al. |
| 8,558,977 B2 | 10/2013 | Gettemy et al. |
| 8,576,332 B2 | 11/2013 | Chang |
| 8,711,304 B2 | 4/2014 | Mathew et al. |
| 8,731,618 B2 | 5/2014 | Jarvis et al. |
| 8,749,496 B2 | 6/2014 | Chang et al. |
| 8,767,141 B2 | 7/2014 | Mathew et al. |
| 8,786,557 B2 | 7/2014 | Noguchi et al. |
| 8,866,989 B2 | 10/2014 | Mathew et al. |
| 8,912,990 B2 | 12/2014 | Vieri et al. |
| 2001/0000676 A1 | 5/2001 | Zhang et al. |
| 2001/0019130 A1 | 9/2001 | Yamazaki et al. |
| 2002/0008838 A1* | 1/2002 | Matsuda ............... G02F 1/1333 349/187 |
| 2002/0051112 A1* | 5/2002 | Katsura ............... G02F 1/1337 349/153 |
| 2002/0063253 A1 | 5/2002 | Hong et al. |
| 2003/0133070 A1* | 7/2003 | Nam ............... G02F 1/1333 349/158 |
| 2003/0161093 A1 | 8/2003 | Lam et al. |
| 2004/0046925 A1 | 5/2004 | Matsuda |
| 2004/0095526 A1 | 5/2004 | Yamabuchi et al. |
| 2004/0212555 A1 | 10/2004 | Falco |
| 2004/0263670 A1 | 12/2004 | Yamasaki |
| 2005/0003793 A1* | 1/2005 | Gohs ............... H04M 1/22 455/347 |
| 2005/0018121 A1* | 1/2005 | Jen ............... G02F 1/1345 349/151 |
| 2005/0041166 A1* | 2/2005 | Yamazaki ............ G02F 1/13452 349/42 |
| 2005/0052737 A1* | 3/2005 | Amemiya ............... G03B 21/62 359/456 |
| 2005/0078252 A1 | 4/2005 | Lin |
| 2005/0195621 A1 | 9/2005 | Chang et al. |
| 2005/0214984 A1* | 9/2005 | Maruyama .......... H01L 21/6835 438/149 |
| 2005/0264689 A1* | 12/2005 | Yang ............... G06F 1/1605 348/373 |
| 2005/0266591 A1* | 12/2005 | Hideo ............... G02F 1/136277 438/22 |
| 2005/0285996 A1 | 12/2005 | Nakamura et al. |
| 2006/0001802 A1 | 1/2006 | Kao |
| 2006/0012969 A1* | 1/2006 | Bachman ............... H05K 9/003 361/816 |
| 2006/0033874 A1* | 2/2006 | Sakama ............... G02F 1/13 349/152 |
| 2006/0092034 A1* | 5/2006 | Worthy ............... B63B 21/20 340/686.1 |
| 2006/0113894 A1* | 6/2006 | Fujii ............... H01L 29/458 313/499 |
| 2006/0125982 A1 | 6/2006 | Lin et al. |
| 2006/0138296 A1 | 6/2006 | DeLuga |
| 2006/0148425 A1* | 7/2006 | Carlson ............... H04M 1/0227 455/90.3 |
| 2006/0176417 A1* | 8/2006 | Wu ............... G02F 1/13452 349/58 |
| 2006/0197740 A1* | 9/2006 | Xu ............... G06F 1/206 345/156 |
| 2006/0223006 A1* | 10/2006 | Shimada ............... B41C 1/1066 430/302 |
| 2006/0227232 A1 | 10/2006 | Zhang et al. |
| 2006/0279652 A1 | 12/2006 | Yang |
| 2007/0002216 A1 | 1/2007 | Chang et al. |
| 2007/0109461 A1 | 5/2007 | Park |
| 2007/0126966 A1 | 6/2007 | Takahashi |
| 2007/0160815 A1* | 7/2007 | Tsuchimura .......... C09D 11/101 428/195.1 |
| 2007/0188675 A1* | 8/2007 | Tsubokura ........ G02F 1/133308 349/58 |
| 2007/0189730 A1 | 8/2007 | Okamura |
| 2007/0197677 A1* | 8/2007 | Tsuchimura .......... B41C 1/1066 522/82 |
| 2007/0222912 A1* | 9/2007 | Sato ............... G02F 1/133528 349/58 |
| 2007/0291172 A1* | 12/2007 | Kouzimoto .......... H04N 13/368 348/488 |
| 2008/0036942 A1 | 2/2008 | Hsieh |
| 2008/0049004 A1* | 2/2008 | Kunimori ........... G02F 1/13318 345/207 |
| 2008/0057604 A1 | 3/2008 | Tanaka |
| 2008/0079860 A1* | 4/2008 | Kunimori ........... G02F 1/13318 349/43 |
| 2008/0117581 A1* | 5/2008 | Kuo ............... G06F 1/1616 361/679.27 |
| 2008/0192171 A1* | 8/2008 | Azuma ............. G02F 1/133308 349/60 |
| 2008/0239754 A1 | 10/2008 | Kang et al. |
| 2008/0261057 A1 | 10/2008 | Slobodin |
| 2008/0266469 A1* | 10/2008 | Chen ............... G09G 3/2092 349/1 |
| 2008/0291356 A1 | 11/2008 | Kim |
| 2009/0033850 A1* | 2/2009 | Ishiguro ............... G02F 1/13338 349/116 |
| 2009/0085848 A1* | 4/2009 | Huang ............... G02B 6/0068 345/88 |
| 2009/0091673 A1* | 4/2009 | Chen ............... G02F 1/1345 349/40 |
| 2009/0135167 A1* | 5/2009 | Sakai ............... G02F 1/13318 345/207 |
| 2009/0146967 A1* | 6/2009 | Ino ............... G02F 1/133526 345/173 |
| 2009/0147179 A1* | 6/2009 | Yamashita ........... G02B 5/0221 349/64 |
| 2009/0147191 A1* | 6/2009 | Nakajima ............ G02F 1/13318 349/116 |
| 2009/0153762 A1* | 6/2009 | Kuwabara ............. H01L 21/288 349/43 |
| 2009/0167978 A1* | 7/2009 | Goto ............... G06F 1/1616 349/58 |
| 2009/0212300 A1* | 8/2009 | Komori ............... H01L 27/1288 257/72 |
| 2009/0237602 A1 | 9/2009 | Kubota et al. |
| 2009/0244410 A1* | 10/2009 | Miyata ............. G02F 1/133308 349/1 |
| 2009/0262277 A1* | 10/2009 | Kim ............... G02F 1/133308 349/58 |
| 2009/0273550 A1 | 11/2009 | Vieri et al. |
| 2009/0279284 A1 | 11/2009 | Takeuchi et al. |
| 2009/0280606 A1* | 11/2009 | Shih ............... H01L 27/14692 438/155 |
| 2009/0286001 A1* | 11/2009 | Kanke ............... C08F 222/40 427/487 |
| 2010/0001973 A1 | 1/2010 | Hotelling et al. |
| 2010/0020277 A1 | 1/2010 | Morita |
| 2010/0026656 A1 | 2/2010 | Hotelling et al. |
| 2010/0039530 A1 | 2/2010 | Guo et al. |
| 2010/0079942 A1 | 4/2010 | Yamamoto |
| 2010/0097525 A1* | 4/2010 | Mino ............... H04N 13/31 348/564 |
| 2010/0100202 A1 | 4/2010 | Chen et al. |
| 2010/0144391 A1 | 6/2010 | Chang et al. |

(56) References Cited

U.S. PATENT DOCUMENTS

| | | | |
|---|---|---|---|
| 2010/0165267 A1* | 7/2010 | Yoshida | G02F 1/13318 349/106 |
| 2010/0167443 A1 | 7/2010 | Okada et al. | |
| 2010/0182273 A1* | 7/2010 | Noguchi | G02F 1/13338 345/174 |
| 2010/0182538 A1 | 7/2010 | Takata | |
| 2010/0207857 A1 | 8/2010 | Gu et al. | |
| 2010/0225844 A1 | 9/2010 | Kamada | |
| 2010/0273530 A1* | 10/2010 | Jarvis | F16F 1/027 455/566 |
| 2010/0302478 A1 | 12/2010 | Nakagawa et al. | |
| 2010/0309102 A1 | 12/2010 | Jung | |
| 2010/0315570 A1 | 12/2010 | Mathew et al. | |
| 2010/0315769 A1 | 12/2010 | Mathew et al. | |
| 2010/0315868 A1* | 12/2010 | Tokunaga | G11C 17/16 365/163 |
| 2010/0321325 A1 | 12/2010 | Springer et al. | |
| 2011/0001706 A1 | 1/2011 | Sanford et al. | |
| 2011/0005662 A1 | 1/2011 | Sung | |
| 2011/0051411 A1 | 3/2011 | Kim et al. | |
| 2011/0058255 A1* | 3/2011 | Weiss | H04M 1/0264 359/511 |
| 2011/0063550 A1 | 3/2011 | Gettemy et al. | |
| 2011/0090444 A1* | 4/2011 | Kimura | H01L 27/1218 349/138 |
| 2011/0103041 A1 | 5/2011 | Mathew et al. | |
| 2011/0109829 A1 | 5/2011 | Mathew et al. | |
| 2011/0149139 A1 | 6/2011 | Chang | |
| 2011/0244656 A1* | 10/2011 | Dairiki | H01L 27/1214 438/460 |
| 2011/0285948 A1* | 11/2011 | Hakoi | G02F 1/133753 349/124 |
| 2012/0014687 A1 | 1/2012 | Sanford et al. | |
| 2012/0020000 A1 | 1/2012 | Mathew et al. | |
| 2012/0020001 A1 | 1/2012 | Mathew et al. | |
| 2012/0020002 A1 | 1/2012 | Matthew et al. | |
| 2012/0020700 A1 | 1/2012 | Yamada | |
| 2012/0050958 A1 | 3/2012 | Sanford et al. | |
| 2012/0050975 A1 | 3/2012 | Garelli et al. | |
| 2012/0105400 A1 | 5/2012 | Mathew et al. | |
| 2012/0106063 A1 | 5/2012 | Mathew et al. | |
| 2013/0215642 A1 | 8/2013 | Mathew et al. | |

FOREIGN PATENT DOCUMENTS

| | | | |
|---|---|---|---|
| JP | 10219948 | 8/1998 | |
| JP | 0030090 | 11/2000 | |
| JP | 2002185589 A * | 6/2002 | H04M 1/0214 |
| JP | 2002271664 A * | 9/2002 | |
| JP | 3387136 | 3/2003 | |
| JP | 06245209 | 3/2003 | |
| JP | 2003289938 A * | 10/2003 | |
| JP | 2004007119 A * | 1/2004 | |
| JP | 2004007121 A * | 1/2004 | |
| JP | 41357275 | 8/2008 | |
| JP | 2009015272 | 1/2009 | |
| JP | 2010190916 A * | 9/2010 | |
| KR | 100400714 | 10/2003 | |
| KR | 20040017693 | 2/2004 | |
| KR | 1020080058911 | 6/2008 | |
| KR | 100856092 | 9/2008 | |
| KR | 1020080089908 | 10/2008 | |
| WO | 08120879 | 10/2008 | |
| WO | WO-2009137600 A2 * | 11/2009 | G03B 11/043 |

* cited by examiner

PORTABLE COMPUTER DISPLAY STRUCTURES

This application is a continuation of U.S. patent application Ser. No. 15/782,458, filed Oct. 12, 2017, which is a continuation of U.S. patent application Ser. No. 14/520,079, filed Oct. 21, 2014, which is a continuation of U.S. patent application Ser. No. 13/786,344, filed Mar. 5, 2013, now U.S. Pat. No. 8,866,989, which is a continuation of U.S. patent application Ser. No. 13/249,174, filed Sep. 29, 2011, now U.S. Pat. No. 8,395,722, which is a continuation of U.S. patent application Ser. No. 12/483,206, filed Jun. 11, 2009, now U.S. Pat. No. 8,456,586, each of which is hereby incorporated by reference herein in its entirety.

BACKGROUND

This invention relates to electronic devices and, more particularly, to display structures for electronic devices such as portable computers.

Portable computers typically have upper and lower housing portions that are connected by a hinge. The lower housing portion contains components such as printed circuit boards, disk drives, a keyboard, and a battery. The upper housing portion contains a display. When the computer is in an open configuration, the upper housing portion is vertical and the display is visible to the user of the portable computer. When the computer is closed, the upper housing lies flat against the lower housing. This protects the display and keyboard and allows the portable computer to be transported.

Portable computer displays typically contain fragile structures such as layers of glass and can be challenging to mount properly within the upper housing. If care is not taken, the display and the surrounding portions of the upper housing will be bulky and unsightly. At the same time, the elimination of certain structures in the display may result in display that is overly fragile. This could lead to damage to the display during normal use.

It would therefore be desirable to be able to provide improved display structures in electronic devices such as portable computers.

SUMMARY

An electronic device such as a portable computer may have a housing. The housing may have upper and lower portions that are connected by a hinge. A display module may be mounted in a portion of the housing such as the upper housing portion.

The upper housing may have a planar rear surface and portions that extend upwards to form peripheral housing sidewalls. The housing sidewalls may extend around the display module to form a border or the display module may be mounted so that the outermost edges of the display module are aligned with the outermost edges of the peripheral housing sidewalls.

The display module may have a color filter glass layer and a thin-film transistor substrate layer. A layer of light-guide structures may be mounted under the thin-film transistor substrate layer. The peripheral edges of the color glass layer and the thin-film transistor substrate layer may extend laterally past the peripheral edges of the light guide structures to form an overhanging structure. The overhanging structure may rest on the peripheral housing edges without any intervening display module chassis members.

An opening may be provided through the color filter and thin-film transistor substrate layers. A camera may receive light through the opening. Other electronic components may also be mounted within the housing of the electronic device such as ambient light sensors, proximity sensors, other sensors, indicator lights such a light-emitting diodes, input-output ports, buttons, microphones and speakers, antennas, etc. These electrical components can be electrically connected to traces formed on the underside of the thin-film transistor substrate layer or traces formed on other glass surfaces.

To block unsightly portions of the device from view around the periphery of the display module, the display module may be provided with an opaque border. The opaque border may be formed from a peripheral ring of black ink. The black ink may be formed on a glass layer such as the color filter glass. A polymer film that includes a black ink may also be used in forming the opaque border.

If desired, the display module may contain no cover glass layers. In this type of configuration, the outermost glass layer in the display module may be formed from the color filter glass. The polymer film layer and other layers such as polarizing layers may be formed on top of the color filter glass layer.

The display module may contain integrated circuits such as display driver circuits. A display driver circuit may be mounted on the thin-film transistor substrate. A support structure such as a glass member with a recess to accommodate the drive circuit may be placed over the driver circuit. The support structure may support coating layers such as the polymer film layer with the opaque border.

Further features of the invention, its nature and various advantages will be more apparent from the accompanying drawings and the following detailed description of the preferred embodiments.

DETAILED DESCRIPTION

Figure 1:
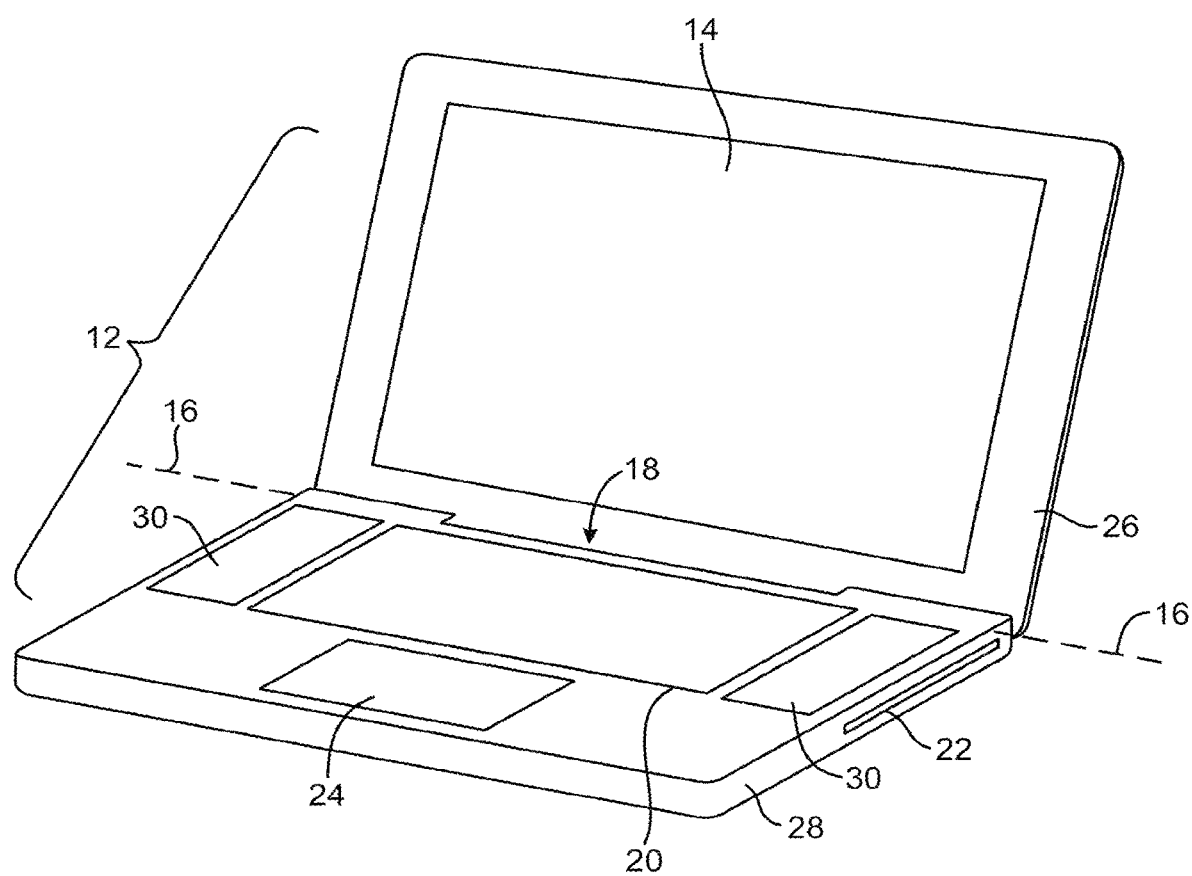
FIG. 1 is a perspective view of an illustrative portable computer with display structures in accordance with an embodiment of the present invention.

An illustrative electronic device such as a portable computer in which display structures may be provided is shown in FIG. 1. As shown in FIG. 1, portable computer 10 may have housing 12. Housing 12, which is sometimes referred to as a case, may be formed from one or more individual structures. For example, housing 12 may have a main structural support member that is formed from a solid block of machined aluminum or other suitable metal. One or more additional structures may be connected to the housing 12. These structures may include, for example, internal frame members, external coverings such as sheets of metal, etc. Housing 12 and its associated components may, in general, be formed from any suitable materials such as plastic, ceramics, metal, glass, etc. An advantage of forming housing 12 at least partly from metal is that metal is durable and attractive in appearance. Metals such as aluminum may be anodized to form an insulating oxide coating.

Housing 12 may have an upper portion 26 and a lower portion 28. Lower portion 28 may be referred to as the base or main unit of computer 10 and may contain components such as a hard disk drive, battery, and main logic board. Upper portion 26, which is sometimes referred to as a cover, lid, or display housing, may rotate relative to lower portion 28 about rotational axis 16. Portion 18 of computer 10 may contain a hinge and associated clutch structures and is sometimes referred to as a clutch barrel.

Lower housing portion 28 may have a slot such as slot 22 through which optical disks may be loaded into an optical disk drive. Lower housing portion may also have a touchpad such as touchpad 24 and may have keys 20. If desired, additional components may be mounted to upper and lower housing portions 26 and 28. For example, upper and lower housing portions 26 and 28 may have ports to which cables can be connected (e.g., universal serial bus ports, an Ethernet port, a Firewire port, audio jacks, card slots, etc.). Buttons and other controls may also be mounted to housing 12. Speaker openings such as speaker openings 30 may be formed in lower housing portion 28 by creating an array of small openings (perforations) in the surface of housing 12.

A display such as display 14 may be mounted within upper housing portion 26. Display 14 may be, for example, a liquid crystal display (LCD), organic light emitting diode (OLED) display, or plasma display (as examples). Display 14 may contain a number of layers of material. These layers may include, for example, layers of optically transparent glass. Layers of plastic and optical adhesive may also be incorporated into display 14. In a liquid crystal display, layers of polarizer, light diffusing elements and light guides for backlight structures, a liquid crystal layer, and a thin-film transistor array that drives the image pixels in the display may be incorporated into the display. The collection of material layers and associated support structures that are used to form display 14 are sometimes referred to as a module. Display 14 may therefore sometimes be referred to as a display module.

Computer 10 may have input-output components such as touch pad 24. Touch pad 24 may include a touch sensitive surface that allows a user of computer 10 to control computer 10 using touch-based commands (gestures). A portion of touchpad 24 may be depressed by the user when the user desires to "click" on a displayed item on screen 14.

Figure 2:
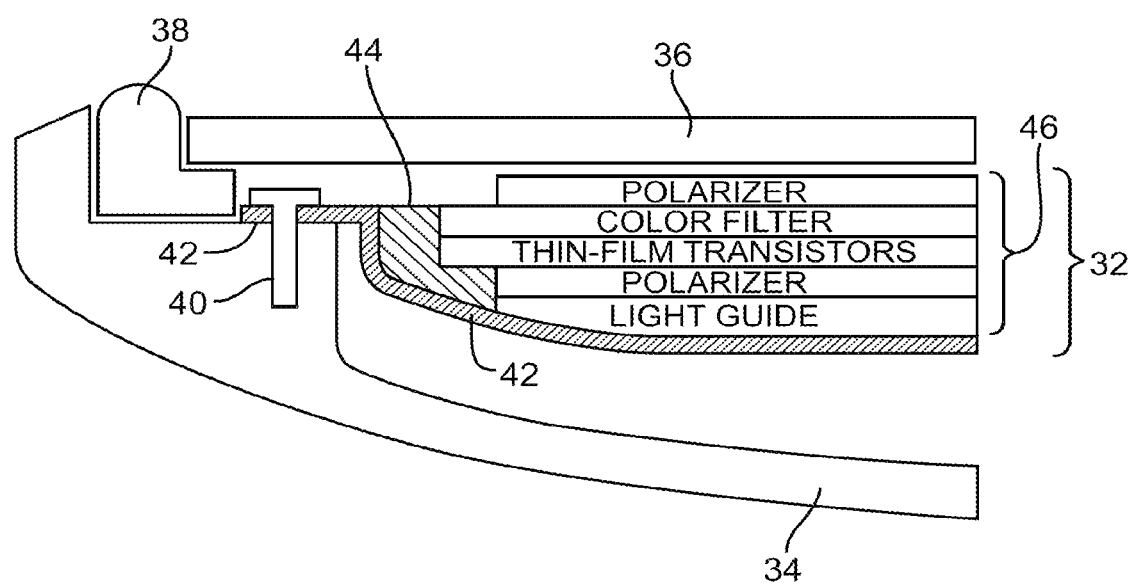
FIG. 2 is a cross-sectional side view of a conventional liquid crystal display (LCD) module in a portable computer display housing.

A cross-sectional side view of a conventional liquid crystal display (LCD) display module is shown in FIG. 2. As shown in FIG. 2, display module 32 may have display structures 46 such as an upper polarizer layer, a color filter, a thin-film transistor glass layer, a lower polarizer, and a layer of light-guide structures such as light guides and diffuser layers. Display module 32 may also have a plastic chassis member such as plastic chassis member 44 and a metal chassis member such as metal chassis member 42 into which the layers of glass and other display module structures may be mounted. Cover glass 36 may be placed on top of structures 46.

Metal chassis member 42 may have a tab with a hole through which screw 40 passes. Screw 40 may be screwed into a threaded hole in housing 34. In the arrangement of FIG. 2, housing 34 is formed of aluminum. The presence of the extending tab portion of chassis 42 allows module 32 to be firmly secured in housing 34, but adds undesirable width to the perimeter of display module 32.

Elastomeric gasket 38 is used to form a cushioned interface between cover glass layer 36 and housing 34. This helps to prevent damage to cover glass layer 36. Cover glass 36 is formed from clear glass and helps to protect layers 46 of LCD module 32 from damage, but adds undesirable thickness.

Figure 3:
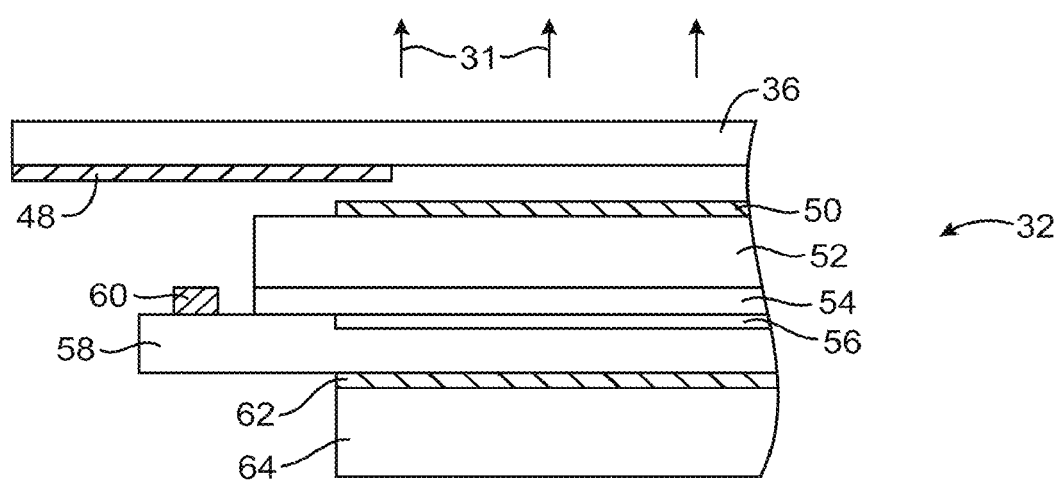
FIG. 3 is a cross-sectional side view of an edge portion of a conventional LCD module.

Another cross-sectional view of a conventional liquid crystal display module is shown in FIG. 3. As shown in FIG. 3, display module 32 may have polarizers such as upper polarizer layer 50 and lower polarizer 62. Light guide structure 64 may provide backlight for module 32. The light from structure 64 passes through the display pixels of module 32 and exits display module 32 in direction 31.

Color filter glass layer 52, liquid crystal layer 54, and thin-film transistor (TFT) glass layer 58 are interposed between polarizer layers 50 and 62.

The polarization of individual pixels of liquid crystal material in liquid crystal layer 54 interacts with the polarizing effects of layers 50 and 62 to determine which display pixels block light and which pixels allow light to pass. Color filter glass layer 52 contains an array of colored filters that provide display 32 with the ability to represent different colors. The polarization of liquid crystal material in liquid crystal layer 54 is controlled electrically by thin-film transistor array 56. Thin-film transistors in array 56 are formed on the upper surface of thin-film transistor (TFT) glass layer 58.

Thin-film transistors 56 are controlled by drivers contained in driver circuit 60. Color filter layer 52 is horizontally (laterally) recessed with respect to TFT layer 58 to form a ledge on which driver circuit 60 is mounted. In a typical display module, there may be a number of driver chips such as circuit 60 that are mounted around the periphery of the display. Conductive traces on the upper surface of TFT layer 58 interconnect driver circuit 60 with thin-film transistors 56.

In conventional arrangements of the type shown in FIG. 3, black ink 48 is placed on the underside of cover glass 36 around the periphery of the display. This creates an opaque region that blocks inactive peripheral portions of display module 32 from view. Black ink 48 can also hide mounting structures such as screw 40 of FIG. 2 from view. Display glass 36 may help provide structural support to the display housing of the portable computer in which display module 32 is mounted, but the presence of glass 36 can add a non-negligible amount of extra thickness and weight to a display.

Display 14 in device 10 (FIG. 1) may be implemented using a display module with structural enhancements. A display module with illustrative enhancements is shown in FIG. 4.

Figure 4:
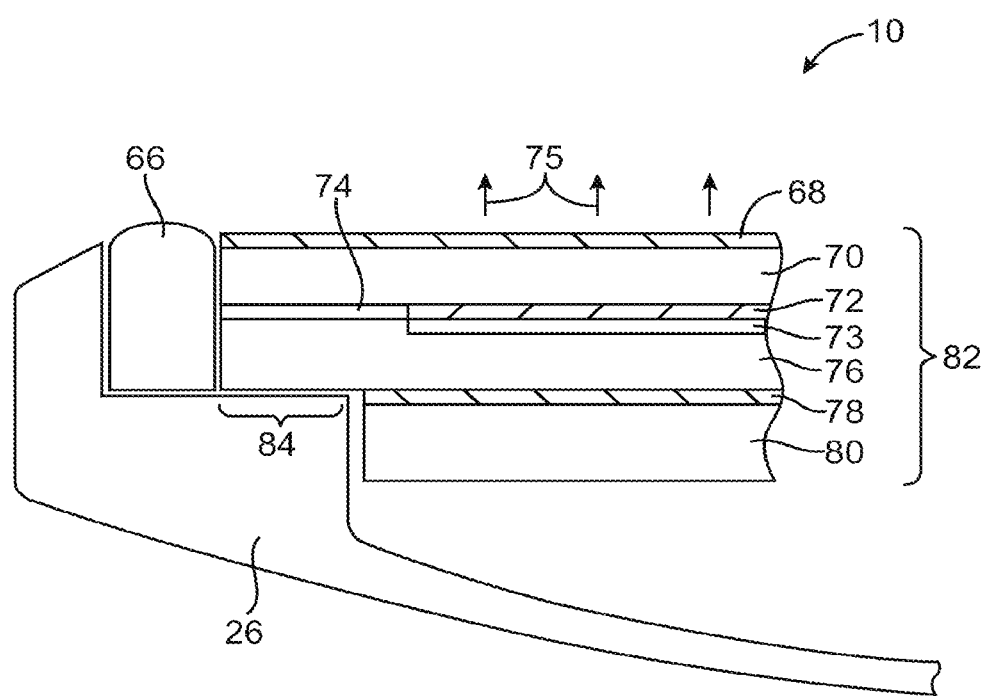
FIG. 4 is a cross-sectional side view of an illustrative display module in an electronic device such as a portable computer in accordance with an embodiment of the present invention.

FIG. 4 shows a cross-sectional side view of a portion of upper housing 26 of device 10 (FIG. 1) in which display module 82 has been mounted. Upper housing 26 may, for example, be formed from machined aluminum. Elastomeric gasket 66 may be used to provide a soft interface between potentially fragile glass layers in module 82 and housing 26.

Display module 82 may produce an image using any suitable display technology (e.g., light-emitting diodes such as an array of organic light-emitting diodes, liquid crystal display pixels, plasma-based pixels, etc.). An arrangement in which display module 82 is based on liquid crystal display (LCD) technology is sometimes described herein as an example. The use of LCD structures in display module 82 is, however, merely illustrative. Display module 82 may, in general, be formed from any suitable type of display structures.

As shown in FIG. 4, display module 82 may have an upper polarizer layer 68 and a lower polarizer layer 78. Light guide structure layer 80 may provide backlight for module 82. Light-guide structure layer 80 may include light guide structures and diffuser layers. These structures may help route light from a light-emitting diode light source or other backlight source through the layers of module 82 in direction 75.

Thin-film transistor substrate glass layer 76 may contain thin-film transistors in array 73. Color filter glass layer 70 may contain an array of optical filters of different colors to provide display module 82 with the ability to display color images. Color filter layer 70 may be formed from glass into which dye of different colors has been impregnated, from a glass layer coated with a pattern of colored dye, from a glass or plastic layer that is covered with a pattern of thin colored filter structures (e.g., filters formed from polymer or glass containing dye), or any other suitable color filter structures. Liquid crystal layer 72 may be controlled by the electric fields produced by the thin-film transistors of array 73.

As shown in FIG. 4, the layer of cover glass that is present in conventional display modules is not present in display module 82 and device 10. Rather, color filter layer 70 serves as the uppermost glass layer in module 82 and device 10. To ensure that module 82 is sufficiently robust, color filter layer 70 may be thickened or may be stiffened using support structures on the underside of display module 82. Color filter layer 70 may be formed of a durable clear layer (e.g., a strong glass or plastic) that resists damage from contact. Anti-scratch coatings may also be provided on the surface of color filter layer 70 (e.g., as part of polarizer layer 68 or above polarizer layer 68).

To hide the peripheral portions of display module 82 that lie along the outer edges of display housing 26 from view, an opaque material such as black ink layer 74 may be incorporated around the periphery of display module 82 to form a black border. Opaque layer 74 may be formed on the underside of color filter layer 70 or on the upper surface of thin-film transistor glass layer 76 (as examples).

With the arrangement of FIG. 4, color filter layer 70 and thin-film transistor layer 76 have been extended outwardly (in the leftward direction in the orientation of FIG. 4) so as to form an overhanging portion 84 that is supported by the matching ledge in housing 26. If desired, only color filter layer 70 may be extended in this way (e.g., so that the overhanging portion of layer 70 rests on the ledge formed by housing 26). In this type of arrangement, the thin-film transistor layer may extend only as far as light-guide structures 80 of FIG. 4. If desired, portions of gasket 66 may be interposed between module 82 and housing 26 in region 84.

Figure 5:
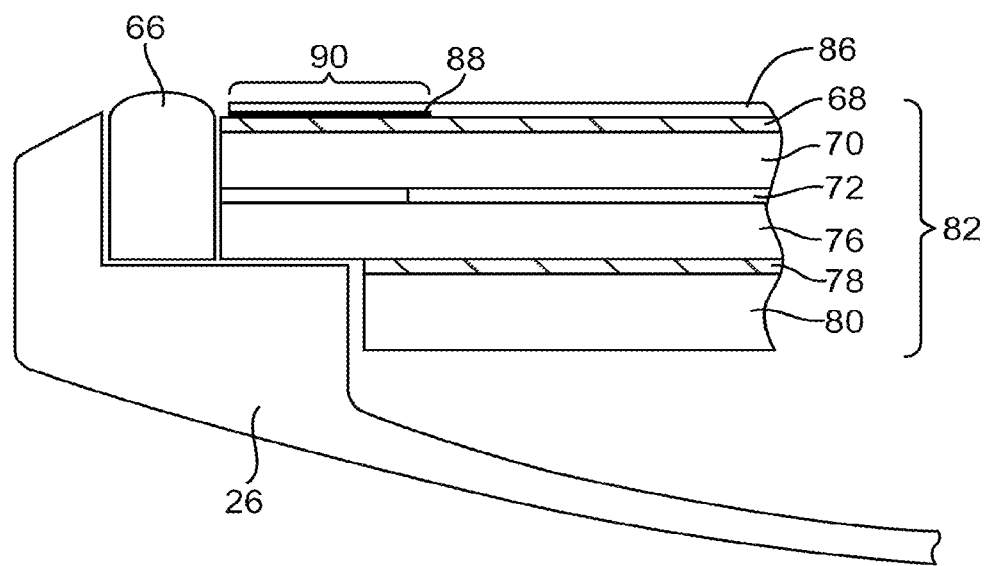
FIG. 5 is a cross-sectional side view of an illustrative display module with a thin plastic coating that has a border region that is coated with an opaque ink in accordance with an embodiment of the present invention.

If desired, black ink layer 74 may be formed above color filter glass layer 70. As shown in FIG. 5, for example, a layer of material such as layer 86 may be provided on the upper surface of color filter glass layer 70. Layer 86 may, for example, be a layer of plastic such as polyester. Ink layer 88 may be printed on the underside of plastic layer 86 in region 90. When plastic layer 86 is attached to the surface of display module 82, the ink in region 90 will block unsightly internal components in housing 26 and module 82 from view by a user. Layers in module 82 may be interconnected using fastening mechanisms and adhesive (e.g., optically clear adhesive such as epoxy).

Figure 6:
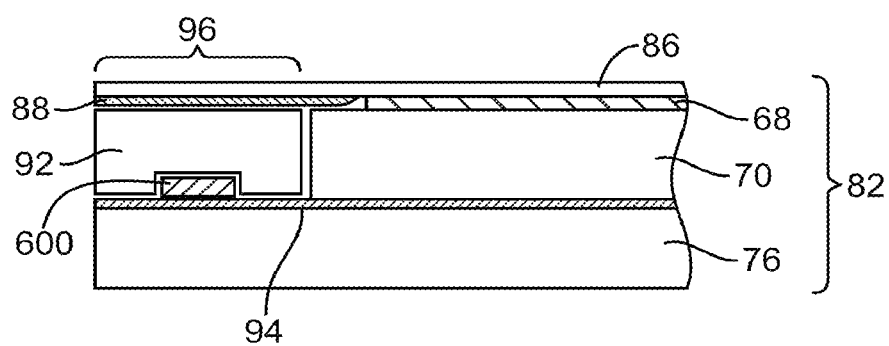
FIG. 6 is a cross-sectional side view of a portion of an illustrative display module for an electronic device such as a portable computer in accordance with an embodiment of the present invention.

Integrated circuits such as display driver circuits may be incorporated into display module 82 to drive display signals into thin-film transistor array 73 (FIG. 4). If desired, circuits such as these or other circuits may be mounted on the upper surface of thin-film transistor substrate layer 76 under a support member. This type of configuration is shown in FIG. 6. As shown in FIG. 6, circuit 600 may be mounted under support 92. Support 92 may have a recessed portion that accommodates the thickness of circuit 600. Circuit 600 may be a display driver circuit or other suitable electrical component for device 10.

With arrangements of the type shown in FIG. 6, support 92 has about the same thickness as color filter glass layer 70 and straddles circuit 600. This allows support structure 92 to support layer 86 in peripheral region 96. Support 92 may be formed from glass, plastic, metal, or other suitable materials. If desired, color filter glass layer 70 may be provided with a recess on its underside that accommodates circuit 600. In this situation, a separate support structure need not be used.

Conductive traces, thin-film transistors, and other circuitry 94 may be formed on the upper surface of thin-film transistor substrate 76. When circuit 600 is mounted on substrate 76, the traces on the surface of substrate layer 76 may convey signals (e.g., display driver signals) to the thin-film transistors on layer 76. Other signals may also be routed using these traces. For example, the traces on layer 76 may be used to route radio-frequency signals, touch sensor signals, signals associated with status indicator lights or other output devices, proximity sensor signals, etc.

Figure 7:
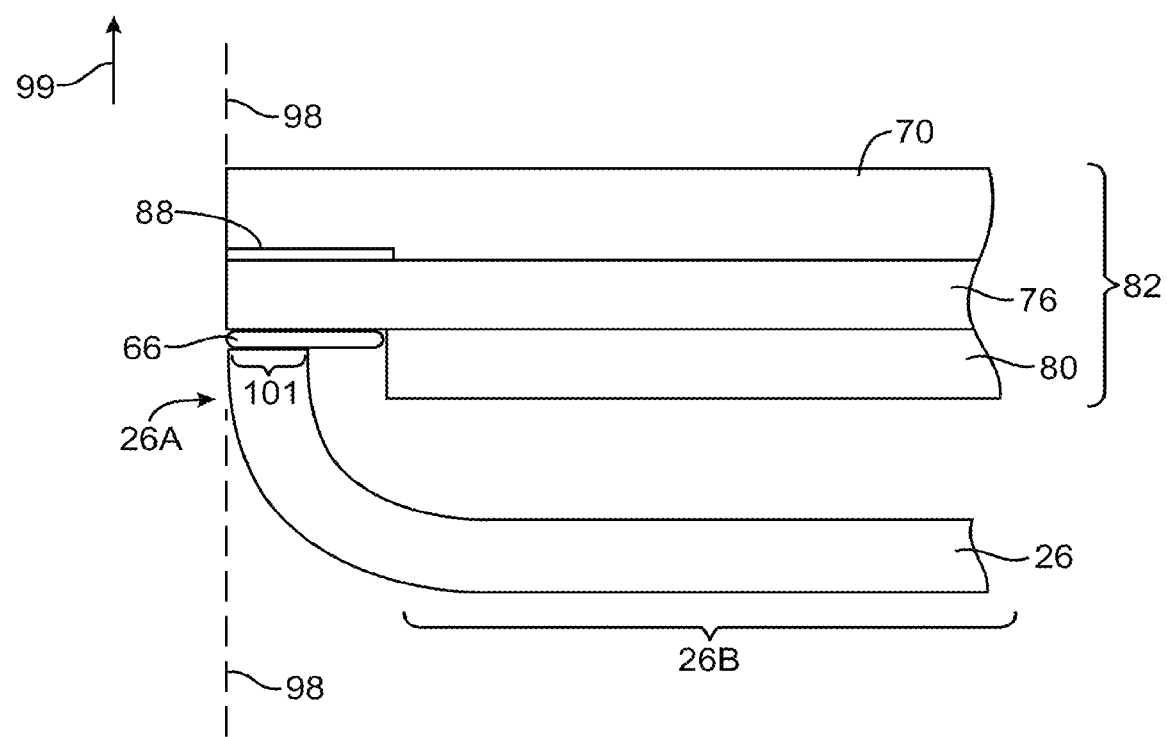
FIG. 7 is a cross-sectional side view of a portion of an illustrative display module that has extending portions that rest on housing walls in an electronic device such as a portable computer in accordance with an embodiment of the present invention.

If desired, housing 26 may be formed directly under the edge of the display module layers. This type of arrangement is shown in FIG. 7. As shown in FIG. 7, display module 82 may have an upper layer formed from color filter 70. Color filter layer 70 may be formed from glass or other suitable material and includes a pattern of colored pixel-sized filters. A band of opaque material such as ink 88 may be formed on the underside of the periphery of color filter layer 70. Ink 88 may hide inactive portions of display module 82 and other structures such as housing 26 from view through the upper surface of display module.

An elastomeric member such as gasket 66 may be used to provide an interface between housing 26 and the underside of thin-film transistor substrate layer 76. Gasket 66 may help prevent glass structures and other structures in display module 82 from being scratched by housing 26 (e.g., when housing 26 is formed from aluminum or other hard materials). If desired, gasket 66 may be omitted or gaskets of other shapes may be used.

Light-guide structure 80 may be located under thin-film transistor layer 76. Structure 80 may contain light guides for directing light through the display, diffuser layers for diffusing light, etc. Polarizer layers may be incorporated into display module 82 above cover glass layer 70 and below thin-film transistor layer 76.

With arrangements of the type shown in FIG. 7, housing 26 may have housing walls that form a substantially planar rear portion with a substantially planar exterior rear surface. In the example of FIG. 7, this is shown by planar rear portion 26B. Portions of the housing sidewalls may also protrude vertically upward (in the orientation of FIG. 7). For example, at least some of housing wall portions 26A around the periphery of housing 26 may extend vertically upward in direction 99. At the uppermost portion of peripheral housing walls 26A, housing wall 26A may be provided with a flat horizontal upper surface 101 that supports the overhanging lower surface of color filter layer 70 and/or thin-film transistor substrate layer 76 (with optional intervening gasket 66). Because the outermost edge of display module 82 (i.e., the leftmost edges of layers 70 and 76) are laterally (horizontally) aligned with the outermost edge portions of housing walls 26A along vertical axis 98, the display module may have the appearance of being borderless. This configuration also allows the active region of the display to be extended close to the outer edge of housing 26.

Electronic device may contain electrical components such as integrated circuits, antennas, and cameras, etc. Traces may be formed on the underside of thin-film transistor layer 76 (i.e., the opposite surface of layer 76 from the surface on which the thin-film transistors are formed). These traces may be used to help route signals to and from the electrical components. Openings may also be formed in the layers of display module 82 to accommodate components. For example, a vertical hole may be formed through color filter layer 70 and thin-film transistor layer 76. This hole may be used to receive light for a camera or to accommodate other electronic components such as a status light indicator (i.e., a status light-emitting diode), a speaker, a microphone, a button, or other suitable electrical component.

Figure 8:
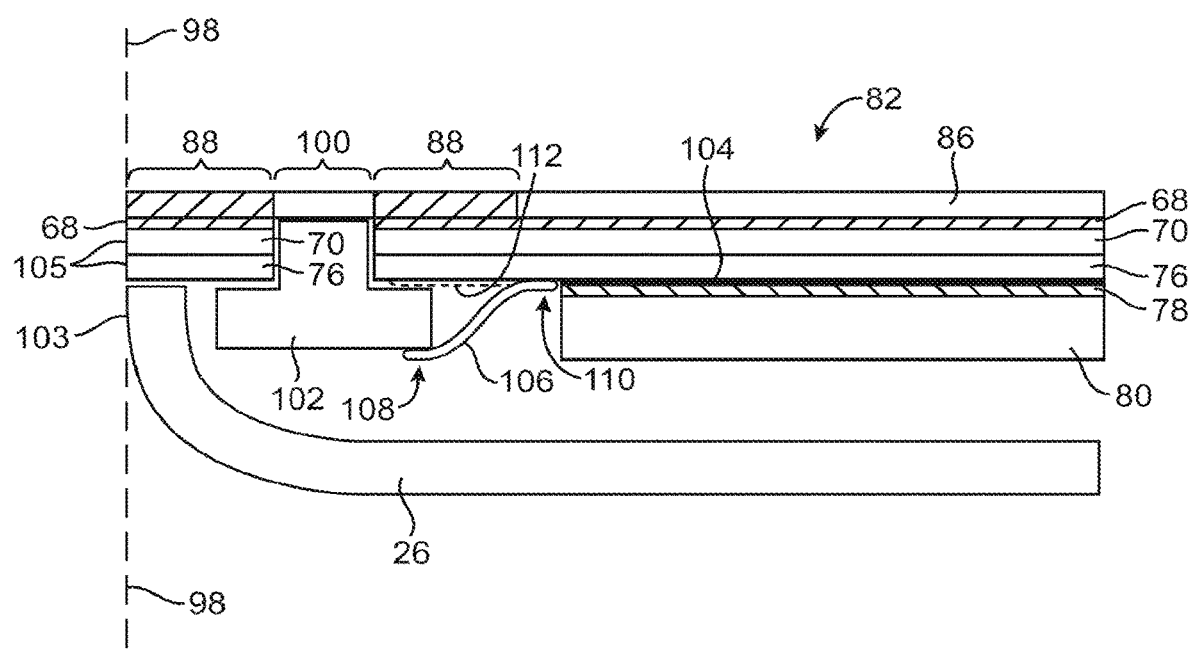
FIG. 8 is a cross-sectional view of an illustrative electronic device showing how components such as a camera module and antenna may be formed through an opening in display module layers such as a color filter glass layer and thin-film transistor substrate layer in accordance with an embodiment of the present invention.

FIG. 8 is a cross-sectional side view of a display module that incorporates features such as these. As shown in FIG. 8, display module 82 may have color filter glass 70 and thin-film transistor glass layer 76. Upper polarizer 68 may be located above color filter glass 70. Lower polarizer 78 may be located below thin-film transistor glass layer 76. A cylindrical hole or other suitable opening such as opening 100 may be formed through color filter glass 70 and thin-film transistor glass layer 76. This hole may be used to accommodate electrical component 102. Electronic component 102 may be a camera, a proximity sensor, an ambient light sensor, an antenna, a microphone, a speaker, a digital data port, an audio jack or other analog port, a button, a touch sensor, etc. Arrangements in which component 102 is a camera are sometimes described herein as an example.

Opaque layer 88 may be formed by printing black ink or other suitable opaque material on a plastic layer such as layer 86 that is attached to the upper surface of polarizer 68 and color filter 70 (as an example). Opaque layer 88 may be formed in a border around the periphery of display module 82 (i.e., along the outermost edge of housing 26). To prevent interference with camera 102 (or other electronic component 102), it may be desirable omit black ink in the region above opening 100.

As with the example of FIG. 7, the illustrative display module configuration of FIG. 8 is mounted in housing 26 so that the outermost peripheral edges of housing 26 (e.g., edge 103) and the outermost edges of filter layer 70 and thin-film transistor layer 76 (e.g., edges 105) are laterally aligned (i.e., outermost edges 103 of housing 26 and the outermost edges 105 of display module 82 are horizontally aligned with the same vertical axis—axis 98—in the cross-sectional view of FIG. 8). As with the FIG. 7 arrangement, this edge alignment can be maintained around the entire periphery of display module 82, providing device 10 with a borderless appearance (i.e., with no visible border-shaped housing structures surrounding the display). If desired, other configurations such as the configuration of FIG. 5 may be used (e.g., configurations in which housing 26 has vertical sidewalls within which module 82 is mounted to create a visible housing border that surrounds module 82 on all four of its outer edges).

Camera 102 contains a digital sensor that generates image data. A flex circuit cable or other data path may be used to covey camera data from camera 102 to storage and processing circuitry in device 10. The upper surface of thin-film transistor layer 76 contains an array of thin-film transistors and associated conductive traces. As shown in the cross-sectional view of FIG. 8, the lower surface of thin-film transistor layer 76 may be provided with traces 104. Flex circuit cable 106 may have contact pads that are electrically connected to camera 102 at end 108 and contact pads that are electrically connected to traces 104 at end 110. Using this type of arrangement, camera data can be conveyed using traces 104. This may help reduce or eliminate the need for additional cables in device 10.

Camera 102 is merely an example of an electrical component for which signals may be routed through underside traces on thin-film transistor substrate 76. In general, any electrical component that produces or receives electrical signals in device 10 can be electrically connected to traces 104. The use of traces 104 on layer 76 can reduce the number of cables used to route signals between these electrical components and processing circuitry in device 10 (i.e., circuits on a main logic board and other storage and processing circuitry in device 10).

As shown by dashed line 112, an antenna may be formed from some of the traces 104 on layer 76. Antenna 112 may be, for example, an antenna for a local wireless network or a cellular telephone.

Traces 104 may be formed from any suitable conductor. In typical configurations for display module 82, backlighting is provided by structures 80. It is therefore typically desirable to form traces 104 from transparent conductive materials such as indium-tin oxide. This is, however, merely one illustrative material that may be used for traces 104. In general, any suitable conductor may be used. Moreover, it is not necessary to form traces 104 on the underside of thin-film transistor substrate layer 76. Traces 104 may be formed on other glass layers in module 82. For example, signal paths for camera signals, antenna signals, or other electrical component signals can be formed from indium-tin oxide patterns on the surface of a cover glass layer, a color filter layer (e.g., layer 70), a glass layer in structures 80, or other suitable display module layers.

Figure 9:
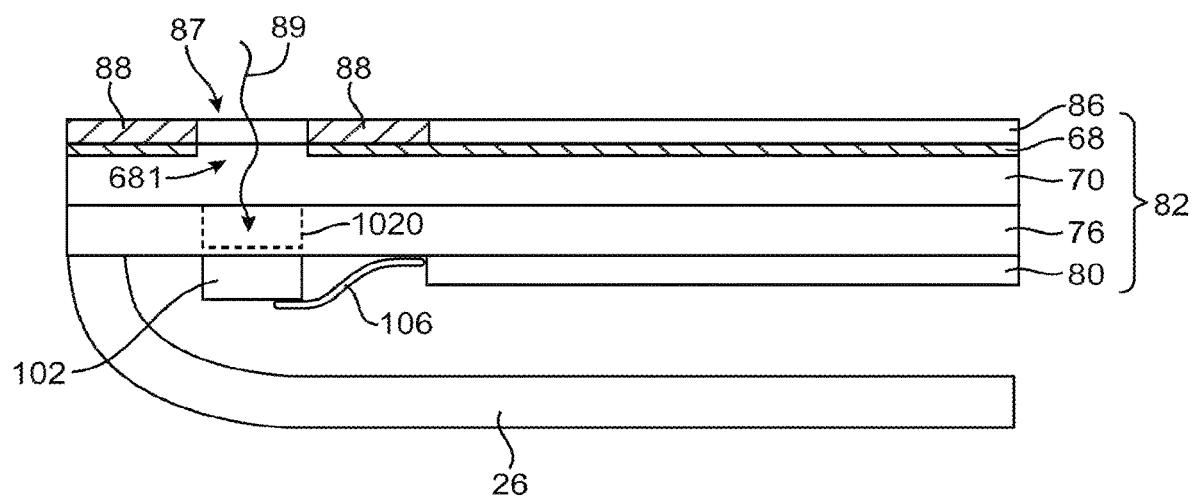
FIG. 9 is a cross-sectional side view of an illustrative electronic device showing how a camera module or other electronic component may be mounted to the underside of a layer of glass in a display module and how the component may operate through a clear window region in the glass in accordance with an embodiment of the present invention.

As shown in the cross-sectional view of FIG. 9, ink border 88 may be provided with opening 87 and polarizer 68 may be provided with opening 681. This allows light to pass to and from the lower layers of display module 82, without forming holes in thin-film transistor substrate layer 76 and color filter glass layer 70. Even though no hole is formed in layers 70 and 76 (in the FIG. 9 example), light for electronic component 102 may still pass through openings 87 and 681 and may pass through the clear portions of layers 70 and 76 under openings 87 and 681. Electronic component 102 may be a camera, sensor, or other suitable electronic component. Component 102 may receive light along path 89. Component 102 may be mounted to the underside of thin-film-transistor layer or, as indicated by dashed line 1020, may be mounted to the underside of color filter glass layer 70.

Figure 10:
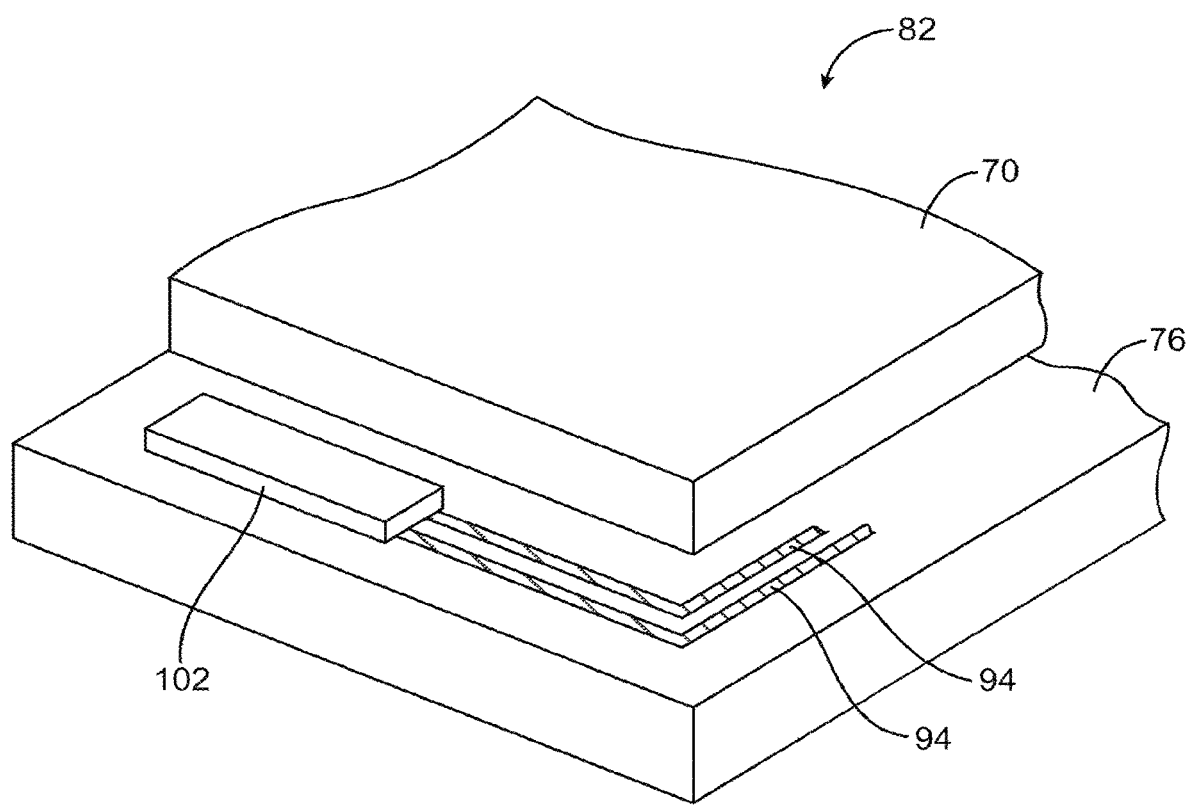
FIG. 10 is a perspective view of a portion of a display module in which an electrical component has been mounted to an upper surface of a thin-film transistor substrate layer and in which conductive traces have been formed that route signals on the upper surface of the thin-film transistor substrate outside of the active area of the display module in accordance with an embodiment of the present invention.

The perspective view of FIG. 10 shows how an electrical component 102 (e.g., a camera, sensor, antenna, button, or any other suitable component) may be mounted to the upper surface of thin-film transistor substrate layer 76 outside of the active area of display module 82. The active area of display module 82 may be aligned with color filter 70 or may have an area that is somewhat smaller than the surface area of color filter 70 (i.e., in alignment with the thin-film transistor array on thin-film transistor substrate 76). As shown in FIG. 10, conductive traces 94 may also be formed outside of the active area to route signals to and from electrical component 102.

Figure 11:
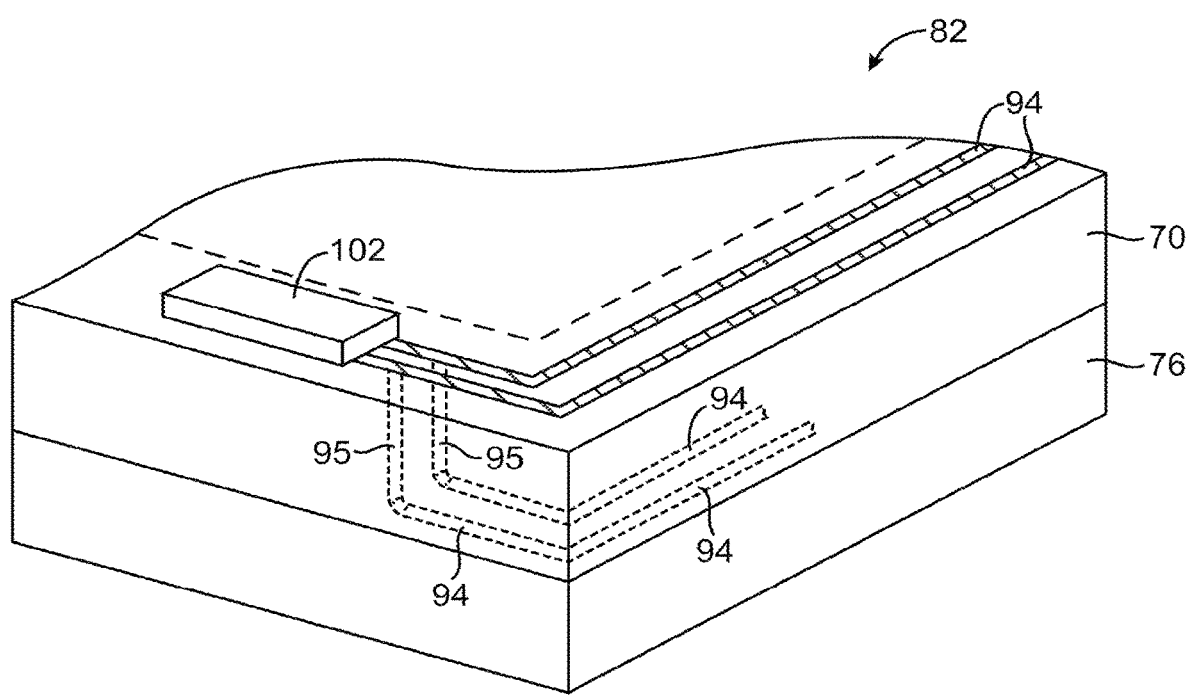
FIG. 11 is a perspective view of a portion of a display module in which an electrical component has been mounted to an upper surface of a color filter glass layer and in which conductive traces have been formed that route signals outside of the active area of the display module in accordance with an embodiment of the present invention.

In the illustrative arrangement of FIG. 11, electrical component 102 has been mounted to an upper surface of color filter glass layer 70. Conductive traces 94 that lie outside of the active area of display module 82 may be used to convey signals to and from electrical component 102. Conductive traces 94 may be formed on the upper surface of color filter glass layer 70 (e.g., under a polymer coating layer or other protective layer) or may be formed on the lower surface of color filter glass layer 70 or the upper surface layer of thin-film transistor substrate layer 76. Vias 95 may be formed through color filter glass layer 70 to interconnect component 102 and conductive traces that have been formed lower in the display module stack. Vias may also be formed through other glass layers such as thin-film transistor substrate layer 76 (e.g., to use traces on the lower surface of the thin-film transistor substrate layer to route signals in module 82).

Figure 12:
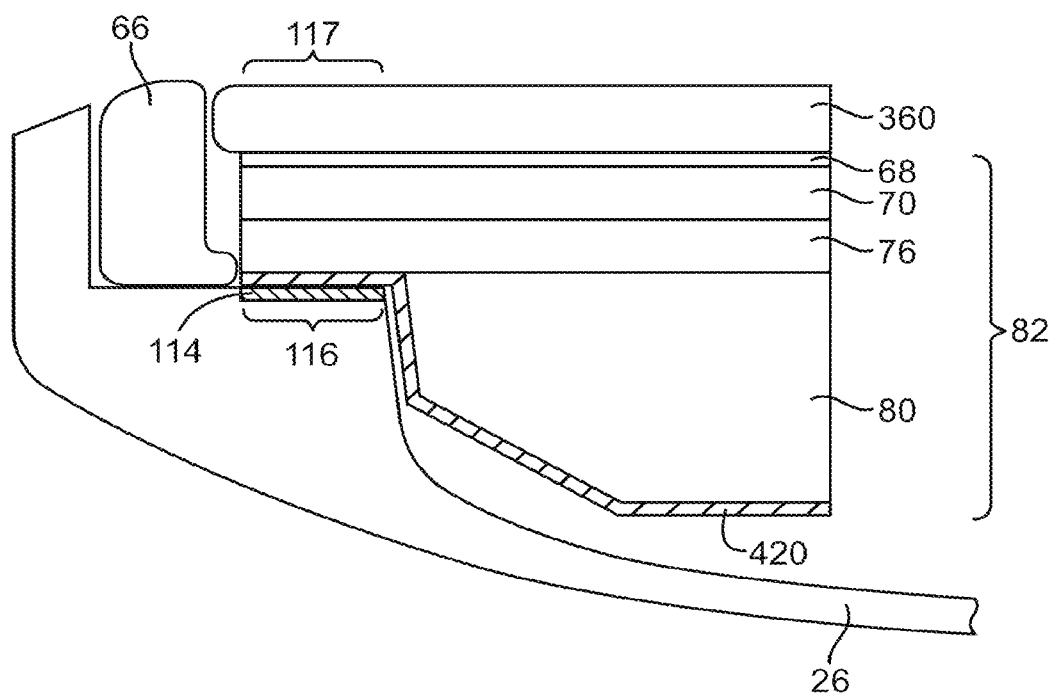
FIG. 12 is a cross-sectional side view of a portion of a display module showing how edge portions of layers of glass such as a cover glass layer, color filter, and thin-film transistor substrate layer may rest on a housing wall ledge above a metal chassis portion in accordance with an embodiment of the present invention.

FIG. 12 is a cross-sectional side view of a portion of a display module showing how layers of glass such as cover glass layer 360, color filter glass 70, and thin-film transistor substrate layer 76 may each have peripheral edge portions 117 that rest on housing wall ledge portion 116 of housing 26. Module 82 may be provided with a chassis such as metal chassis member 420. A laterally extending edge portion of member 420 may also rest on ledge 116 below cover glass 360, color filter 70, and thin-film transistor substrate 76. Adhesive 114 may be used to secure these layers to housing 26.

Figure 13:
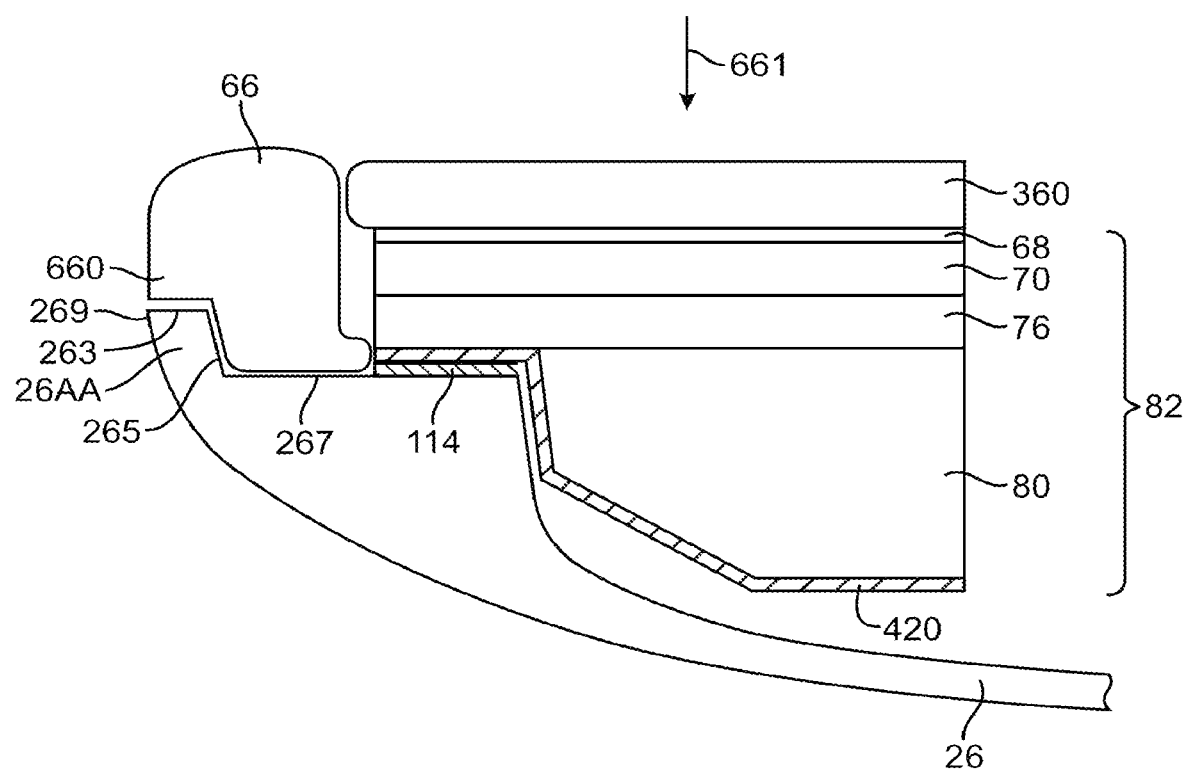
FIG. 13 is a cross-sectional side view of a portion of a display module in which an elastomeric trim structure has been used to cover the uppermost surfaces of a housing wall in accordance with an embodiment of the present invention.

FIG. 13 shows an arrangement of the type shown in FIG. 12 in which elastomeric trim 66 (sometimes referred to as a gasket) has extending portion 660. Extending portion 660 covers portion 26AA of housing 26 and all of the exposed upper surfaces of housing 26 (i.e., all of surfaces 263, 265, and 267, including the portions of surface 263 that are adjacent to peripheral outer edge 269 of housing 26). Because all upper surface portions of housing 26 are covered (either with cover glass or trim), the arrangement of FIG. 13 helps improve the cosmetic appearance of device 10 when viewed from direction 661.

The foregoing is merely illustrative of the principles of this invention and various modifications can be made by those skilled in the art without departing from the scope and spirit of the invention.

What is claimed is:

1. An electronic device comprising:
    a display comprising:
        a layer having a first opening;
        a transparent layer that overlaps the layer;
        an opaque masking layer between the transparent layer and the layer, wherein the opaque masking layer defines a second opening and wherein at least a portion of the second opening overlaps the first opening; and
    a light-sensing component overlapped by the transparent layer, wherein the light-sensing component receives light through the transparent layer and the second opening, and wherein the light-sensing component is aligned with the first opening.

2. The electronic device defined in claim 1 further comprising:
    a housing having a rear portion and housing walls that extend from the rear portion, wherein the display is mounted in the housing, wherein the housing walls have exterior surfaces, and wherein the transparent layer is aligned with the exterior surface of at least one of the housing walls.

3. The electronic device defined in claim 1 wherein the display is an organic light-emitting diode display.

4. The electronic device defined in claim 3 wherein the light-sensing component is selected from the group of components consisting of: a camera, an ambient light sensor, and a proximity sensor.

5. The electronic device defined in claim 3 wherein the layer is a polarizer and wherein the light-sensing component is aligned with the first opening in the polarizer.

6. The electronic device defined in claim 3 wherein the display further comprises thin-film transistor circuitry on the layer.

7. An electronic device comprising:
    a display having a plurality of display layers, wherein a first display layer of the plurality of display layers has an opening and wherein a second display layer of the plurality of display layers overlaps the first display layer and the opening;
    an upper transparent layer that overlaps the plurality of display layers; and
    a light-sensing component that receives light through the second display layer and the upper transparent layer and that is aligned with at least a portion of the opening in the first display layer.

8. The electronic device defined in claim 7 wherein the display is an organic light-emitting diode display.

9. The electronic device defined in claim 8 wherein the first display layer is a polarizer layer and wherein the light-sensing component is aligned with the opening in the polarizer layer.

10. The electronic device defined in claim 9 wherein the organic light-emitting diode display has an active area and an inactive area, and wherein the polarizer layer overlaps the active area and the inactive area.

11. The electronic device defined in claim 10 wherein the light-sensing component is mounted in the inactive area and wherein the opening in the polarizer layer is formed in the inactive area.

12. The electronic device defined in claim 11 further comprising:
    an opaque border in the inactive area, wherein the opaque border has an opening that is aligned with the opening in the polarizer layer.

13. The electronic device defined in claim 7 further comprising thin-film transistor circuitry on the first display layer.

* * * * *